(12) United States Patent
Watanabe (10) Patent No.: US 9,112,061 B2
(45) Date of Patent: Aug. 18, 2015

(54) SEMICONDUCTOR DEVICE AND METHOD OF FORMING THE SAME

(75) Inventor: Mitsuhisa Watanabe, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 600 days.

(21) Appl. No.: 12/784,170

(22) Filed: May 20, 2010

(65) Prior Publication Data

US 2010/0295167 A1 Nov. 25, 2010

(30) Foreign Application Priority Data

May 22, 2009 (JP) .................................. 2009-124141

(51) Int. Cl.
| H01L 23/48 | (2006.01) |
| H01L 23/52 | (2006.01) |
| H01L 29/40 | (2006.01) |
| H01L 23/00 | (2006.01) |

(52) U.S. Cl.
CPC ....... *H01L 24/97* (2013.01); *H01L 2224/45144* (2013.01); *H01L 2224/48091* (2013.01); *H01L 2224/49171* (2013.01); *H01L 2224/97* (2013.01); *H01L 2924/01005* (2013.01); *H01L 2924/01006* (2013.01); *H01L 2924/01029* (2013.01); *H01L 2924/01033* (2013.01); *H01L 2924/01079* (2013.01); *H01L 2924/07802* (2013.01); *H01L 2924/13091* (2013.01); *H01L 2924/15311* (2013.01)

(58) Field of Classification Search
USPC .......................................................... 257/693
See application file for complete search history.

(56) References Cited

U.S. PATENT DOCUMENTS

| 6,014,318 | A | * | 1/2000 | Takeda ........................... 361/764 |
| 6,573,612 | B1 | | 6/2003 | Miyata |
| 2003/0151143 | A1 | * | 8/2003 | Tsai et al. ...................... 257/774 |
| 2007/0126122 | A1 | * | 6/2007 | Bauer et al. .................... 257/774 |

FOREIGN PATENT DOCUMENTS

| JP | 8-235665 A | 9/1996 |
| JP | 10-223795 A | 8/1998 |
| JP | 2001-44229 A | 2/2001 |
| JP | 2003-133521 A | 5/2003 |
| JP | 2007-019116 A | 1/2007 |
| JP | 2007-19126 A | 1/2007 |
| JP | 2007-42824 A | 2/2007 |

* cited by examiner

*Primary Examiner* — Thien F Tran (57) ABSTRACT

A semiconductor device includes an insulating substrate, a semiconductor chip, an insulating layer, and a sealing layer. The insulating substrate has an opening. A semiconductor chip is disposed in the opening. An insulating layer is disposed on a first surface of the insulating substrate. The insulating layer covers the opening. The sealing layer is disposed on a second surface of the insulating substrate. The sealing layer seals the semiconductor chip and the opening.

21 Claims, 5 Drawing Sheets

SEMICONDUCTOR DEVICE AND METHOD OF FORMING THE SAME

BACKGROUND OF THE INVENTION

1. Field of the Invention

The present invention generally relates to a semiconductor device and a method of forming the same.

Priority is claimed on Japanese Patent Application No. 2009-124141, filed May 22, 2009, the content of which is incorporated herein by reference.

2. Description of the Related Art

A semiconductor device having a BGA (Ball Grid Array) structure has been known. A semiconductor chip is mounted on a semiconductor substrate such as a wiring substrate having wiring patterns that are formed on one surface thereof Japanese Unexamined Patent Application, First Publication, No. JP-A-2001-044229 discloses such a semiconductor device. The semiconductor device has a BGA structure. The semiconductor device includes predetermined circuits on one surface of the wiring substrate. The semiconductor device includes a semiconductor chip having plural electrode pads mounted on the surface of the wiring substrate. A matrix array of solder balls is disposed on the other surface of the wiring substrate. Solder balls serve as external electrodes that correspond to the electrode pads on the semiconductor chip. The electrode pads on the semiconductor chip and the corresponding external electrodes are electrically connected to each other via wires of the wiring substrate. A sealing member is disposed on one surface of the wiring substrate. The sealing member covers at least connection portions between the semiconductor chip and the wiring substrate.

The semiconductor device having the past BGA structure can be manufactured by an MAP (Mold Array Process) for manufacturing plural products at a time.

Japanese Unexamined Patent Application, First Publication, No. JP-A-2003-133521 discloses that to decrease the thickness of the semiconductor device, there was suggested a semiconductor device having the BGA structure using a wiring substrate having an opening. Japanese Unexamined Patent Application, First Publication, No. JP-A-2003-133521 discloses the semiconductor device configured to dispose a semiconductor chip in the opening of the wiring substrate by the use of a support tape. This configuration provides a clearance between the semiconductor devices. This configuration allows stacking the semiconductor devices having the BGA structure with reduced stress applied to the connecting portions between the semiconductor devices.

The semiconductor device disclosed in Japanese Unexamined Patent Application, First Publication, No. JP-A-2001-044229 has the following issues. The semiconductor chip is bonded and fixed to the wiring substrate through a DAF (Die Attach Film) or an adhesive. When a material having a different coefficient of thermal expansion is bonded and fixed to the wiring substrate, stress is generated in the semiconductor device in manufacture, and this stress is applied to the external electrodes. The external electrodes may be broken due to this stress.

The semiconductor device disclosed in Japanese Unexamined Patent Application, First Publication, No. JP-A-2003-133521 discloses the following problems. The balance of thermal expansion is poor between the support tape disposed on one surface of the wiring substrate and the sealing member disposed on the other surface thereof, and stress or bending may be caused in the semiconductor device. When stress or bending is caused, disconnection may be caused at the time of mounting the semiconductor device on a main substrate or the like. The external electrodes are not partially connected. Particularly, in the semiconductor device having plural semiconductor devices stacked, bending or stress of each of the stacked semiconductor devices has a great influence. In the related art, the reliability of secondary mounting is lowered due to the generation of stress or bending of each of the stacked semiconductor devices.

SUMMARY

In one embodiment, a semiconductor device may include, but is not limited to, an insulating substrate, a semiconductor chip, an insulating layer, and a sealing layer. The insulating substrate has an opening. A semiconductor chip is disposed in the opening. An insulating layer is disposed on a first surface of the insulating substrate. The insulating layer covers the opening. The sealing layer is disposed on a second surface of the insulating substrate. The sealing layer seals the semiconductor chip and the opening.

In another embodiment, a semiconductor device may include, but is not limited to, an insulating substrate, a semiconductor chip, external electrodes and conductors. The insulating substrate has an opening. The semiconductor chip is disposed inside the space of the opening. External electrodes are disposed on a first surface of the insulating substrate. Conductors electrically connect the external electrodes to the semiconductor chip.

In still another embodiment, a semiconductor device may include, but is not limited to, a wiring substrate, a semiconductor chip, a sealing resin layer, and external electrodes. The wiring substrate may include, but is not limited to, an insulating substrate, a first wiring layer, a second wiring layer, a through-wire, ands an insulating layer. The insulating substrate has an opening. The first wiring layer is disposed on the first surface of the insulating substrate. The second wiring layer is disposed on the second surface of the insulating substrate. The through-wire penetrates the insulating substrate. The through-wire connects the first wiring layer and the second wiring layer. The insulating layer is disposed on a first surface of the insulating substrate. The insulating layer covers the opening. The semiconductor chip is disposed in the opening. The semiconductor chip is electrically connected to the second wiring layer. The sealing resin layer is disposed on a second surface of the insulating substrate. The sealing resin layer seals the semiconductor chip and the opening. The external electrodes are disposed on the first surface of the insulating substrate. The external electrodes are partially exposed from the insulating layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

In one embodiment, a semiconductor device may include, but is not limited to, an insulating substrate, a semiconductor chip, an insulating layer, and a sealing layer.

The insulating substrate has an opening. A semiconductor chip is disposed in the opening. An insulating layer is disposed on a first surface of the insulating substrate. The insulating layer covers the opening. The sealing layer is disposed on a second surface of the insulating substrate. The sealing layer seals the semiconductor chip and the opening.

In some cases, the semiconductor device may further include, but is not limited to, external electrodes disposed on the first surface of the insulating substrate. The external electrodes are partially exposed from the insulating layer.

In these cases, the semiconductor device may further include, but is not limited to, conductors electrically connecting the external electrodes to the semiconductor chip.

In some cases, each of the conductors may include, but is not limited to, a first wiring layer, a second wiring layer, and a through-wire. The first wiring layer is disposed on the first surface of the insulating substrate. The first wiring layer is connected to the external electrode. The second wiring layer is disposed on the second surface of the insulating substrate. The through-wire penetrates the insulating substrate. The through-wire connects the first wiring layer and the second wiring layer.

In these cases, the second wiring layer may be bonded via a bonding-wire to the semiconductor chip. The bonding-wire may be buried in the sealing layer.

In some cases, a first thickness of the insulating layer may be substantially the same as a second thickness of the sealing layer. The second thickness is defined between the second substrate and a surface of the sealing layer.

In some cases, the insulating layer may be substantially the same in coefficient of thermal expansion as the sealing layer.

In some cases, a first thickness of the insulating layer may be thinner than a second thickness of the sealing layer. The second thickness is defined between the second substrate and a surface of the sealing layer. The insulating layer is greater in coefficient of thermal expansion than the sealing layer.

In some cases, a first thickness of the insulating layer may be thicker than a second thickness of the sealing layer. The second thickness is defined between the second substrate and a surface of the sealing layer. The insulating layer may be smaller in coefficient of thermal expansion than the sealing layer.

In some cases, the insulating layer may cover entirely the first surface of the insulating substrate.

In some cases, the sealing layer may cover entirely the second surface of the insulating substrate.

In some cases, the semiconductor chip may be mounted on the insulating layer.

In another embodiment, a semiconductor device may include, but is not limited to, an insulating substrate, a semiconductor chip, external electrodes and conductors. The insulating substrate has an opening. The semiconductor chip is disposed inside the space of the opening. External electrodes are disposed on a first surface of the insulating substrate. Conductors electrically connect the external electrodes to the semiconductor chip.

In some cases, the semiconductor device may include, but is not limited to, an insulating layer on the first surface of the insulating substrate. The insulating layer covers the opening. The sealing layer is disposed on the second surface of the insulating substrate. The sealing layer seals the semiconductor chip and the opening.

In still another embodiment, a semiconductor device may include, but is not limited to, a wiring substrate, a semiconductor chip, a sealing resin layer, and external electrodes. The wiring substrate may include, but is not limited to, an insulating substrate, a first wiring layer, a second wiring layer, a through-wire, ands an insulating layer. The insulating substrate has an opening. The first wiring layer is disposed on the first surface of the insulating substrate. The second wiring layer is disposed on the second surface of the insulating substrate. The through-wire penetrates the insulating substrate. The through-wire connects the first wiring layer and the second wiring layer. The insulating layer is disposed on a first surface of the insulating substrate. The insulating layer covers the opening. The semiconductor chip is disposed in the opening. The semiconductor chip is electrically connected to the second wiring layer. The sealing resin layer is disposed on a second surface of the insulating substrate. The sealing resin layer seals the semiconductor chip and the opening. The external electrodes are disposed on the first surface of the insulating substrate. The external electrodes are partially exposed from the insulating layer.

In some cases, a first thickness of the insulating layer may be substantially the same as a second thickness of the sealing layer. The second thickness is defined between the second substrate and a surface of the sealing layer.

In some cases, the insulating layer may be substantially the same in coefficient of thermal expansion as the sealing layer.

In some cases, a first thickness of the insulating layer may be thinner than a second thickness of the sealing layer. The second thickness is defined between the second substrate and a surface of the sealing layer. The insulating layer may be greater in coefficient of thermal expansion than the sealing layer.

In some cases, a first thickness of the insulating layer may be thicker than a second thickness of the sealing layer. The second thickness is defined between the second substrate and a surface of the sealing layer. The insulating layer may be smaller in coefficient of thermal expansion than the sealing layer.

In yet another embodiment, a method of forming a semiconductor device may include, but is not limited to, the following processes. A wiring substrate is prepared. The wiring substrate may include, but is not limited to, an insulating substrate, a first wiring layer, a second wiring layer, a through-wire, ands an insulating layer. The insulating substrate has an opening. The first wiring layer is disposed on the first surface of the insulating substrate. The second wiring layer is disposed on the second surface of the insulating substrate. The through-wire penetrates the insulating substrate. The through-wire connects the first wiring layer and the second wiring layer. The insulating layer is disposed on a first surface of the insulating substrate. The insulating layer covers the opening. A semiconductor chip is formed in the opening. A sealing resin layer is formed on a second surface of the insulating substrate. The sealing resin layer seals the semiconductor chip and the opening. External electrodes are formed on the first surface of the insulating substrate. The external electrodes are partially exposed from the insulating layer.

In some cases, the wiring substrate can be prepared by forming the opening in the insulating substrate, forming the conductors in the insulating substrate, and forming the insulating layer on the first surface of the insulating substrate.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

(Semiconductor Device)

Figure 1:
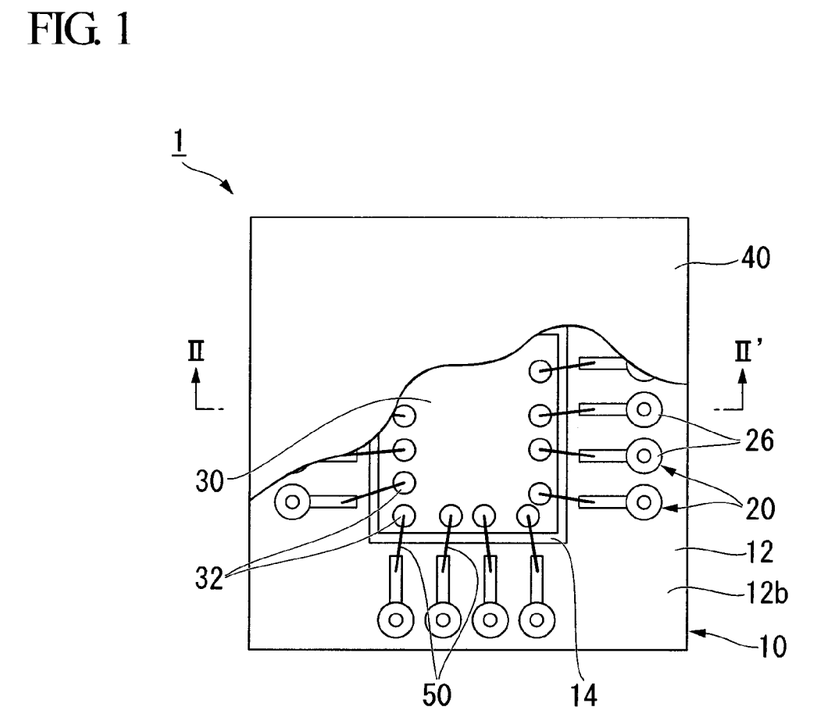
FIG. 1 is a fragmentary plan view illustrating a semiconductor device in accordance with a first preferred embodiment of the present invention.
Figure 2:
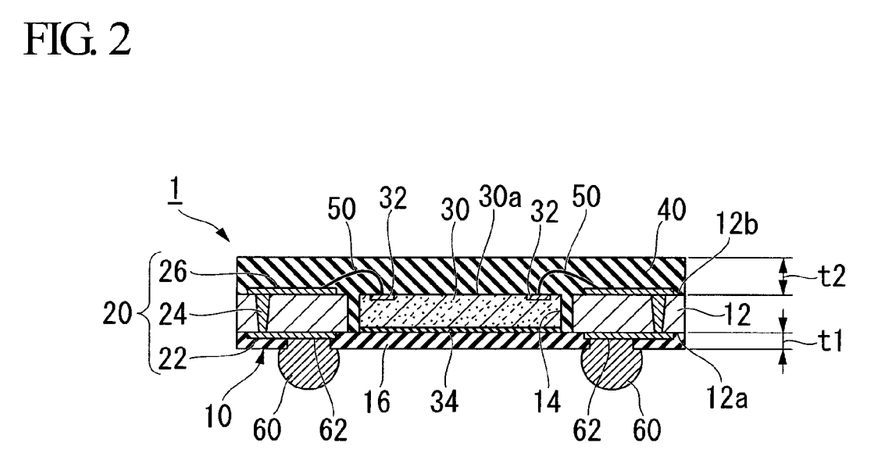
FIG. 2 is a fragmentary cross sectional elevation view, taken along a II-II' line of FIG. 1.

A semiconductor device according to an embodiment of the invention will be described with reference to FIGS. 1 and 2. FIG. 1 is a plan view of a semiconductor device 1 according to an embodiment of the invention. FIG. 2 is a sectional view taken along line II-II' of FIG. 1.

As shown in FIGS. 1 and 2, the semiconductor device 1 is a BGA-type semiconductor device. The semiconductor device 1 includes a substantially rectangular shaped wiring substrate 10 having a substantially rectangular-shaped opening 14. The semiconductor device 1 also includes a semiconductor chip 30 disposed in the substantially rectangular-shaped opening 14 of the wiring substrate 10.

The wiring substrate 10 includes a substantially rectangular-shaped insulating member 12 having the opening 14. The wiring substrate 10 includes plural conductors 20 that surround the periphery of the opening 14. The wiring substrate 10 includes an insulating layer 16 that is stacked on one surface 12a of the insulating member 12. The insulating layer 16 covers the opening 14. Each conductor 20 includes a first wiring layer 22 disposed on a surface 12a of the insulating member 12. Each conductor 20 includes a second wiring layer 26 disposed on a surface 12b of the insulating member 12. Each conductor 20 includes a through-wire 24 passing through the insulating member 12. The through-wire 24 electrically connects the first wiring layer 22 and the second wiring layer 26. The insulating layer 16 is stacked to form a land portion 62 by exposing at least a part of the first wiring layer 22. A metallic ball (external electrode) 60 made of solder is formed on the land portion 62. The land portions 62 are arranged, for example, in a grid array or a lattice array.

In the opening 14, the semiconductor chip 30 is fixed to the insulating layer 16 with an adhesive layer 34 interposed therebetween. The semiconductor chip 30 is disposed so that the sides thereof are separated from the inner wall of the opening 14 by about 10 μm.

A predetermined circuit (not shown) is disposed on a surface 30a of the semiconductor chip 30. Plural electrode pads 32 are disposed on the periphery of the surface 30a of the semiconductor chip 30. The electrode pads 32 are connected to the corresponding second wiring layers 26 by bonding wires 50 (hereinafter, simply referred to as "wires") formed of a conductive material such as Au. In this way, the semiconductor chip 30 is electrically connected to the metallic balls 60 via the conductors 20 and the wires 50. An insulating passivation film not shown is disposed on the surface 30a of the semiconductor chip 30 except for the electrode pads 32, whereby the circuit disposed on the surface 30a is protected.

A sealing resin layer 40 is stacked on the other surface 12b of the insulating member 12. The sealing resin layer 40 covers the opening 14, the semiconductor chip 30, and the wires 50.

The insulating member 12 may be, for example, a glass epoxy material. The thickness of the insulating member 12 is preferably, for example, in the range of 50 μm to 200 μm and is more preferably the same as the thickness of the mounted semiconductor chip 30. When the thickness is in the above-mentioned range, the thickness of the semiconductor device 1 can be reduced and proper strength can be maintained. The coefficient of thermal expansion (CTE) of the insulating member 12 can be determined in consideration of the CTE of the semiconductor chip 30, and the CTE is preferably, for example, in the range of $5\times10^{-6}/°$ C. to $15\times10^{-6}/°$ C. For example, the CTE is preferably $5\times10^{-6}/°$ C. which is equal to the CTE of Si as a base material of the semiconductor chip 30.

The CTE is a linear expansion coefficient. The CTE is the value of the ratio at which the length varies with a rise in temperature (which is the same hereinafter).

The insulating layer 16 is formed of, for example, solder resist. The thickness t1 (see FIG. 2) of the insulating layer 16 can be determined in consideration of the thickness of the sealing resin layer 40 or the like. The thickness t1 can be determined, for example, in the range of 20 μm to 300 μm. The thickness t1 is preferably in the range of 20 μm to 40 μm.

The CTE of the insulating layer 16 can be determined in consideration of the thickness t1 of the insulating layer 16. For example, when the thickness t1 of the insulating layer 16 is in the range of 20 μm to 40 μm, the CTE is preferably set in the range of $20\times10^{-6}/°$ C. to $30\times10^{-6}/°$ C. For example, when the thickness t1 is 40 μm, the CTE is preferably set to 30×10$^{-6}$/° C. By setting the thickness and the CTE as described above, the insulating layer 16 and the sealing resin layer 40 can be balanced in thermal expansion, thereby reducing the generation of stress or bending in the semiconductor device 1 due to the thermal expansion.

The sealing resin layer 40 is a sealing resin formed of thermosetting resin such as an epoxy resin. The thickness t2 (see FIG. 2) of the sealing resin layer 40 can be determined in consideration that the wires 50 are not exposed from the sealing resin layer 40. The thickness t2 is preferably in the range of 100 μm to 300 μm. The thickness t2 of the sealing resin layer 40 is a thickness above the surface 12b of the insulating member 12. The sealing resin layer 40 having the thickness t2 does not include the part filled in the clearance between the opening 14 and the semiconductor chip 30.

The CTE of the sealing resin layer 40 can be determined in consideration of the thickness t2 of the sealing resin layer 40. For example, when the thickness t2 of the sealing resin layer 40 is in the range of 100 μm to 300 μm, the CTE can be set preferably in the range of 5×10$^{-6}$/° C. to 20×10$^{-6}$/° C. For example, when the thickness t2 is 200 μm, the CTE can be set preferably at 6×10$^{-6}$/° C. By setting the thickness and the CTE as described above, the insulating layer 16 and the sealing resin layer 40 can be balanced in thermal expansion, thereby reducing the generation of stress or bending in the semiconductor device 1 due to the thermal expansion.

By adjusting the thicknesses and the CTEs of the insulating layer 16 and the sealing resin layer 40, it is possible to further reduce bending of the semiconductor device 1.

For example, it is preferable that the thickness t1 of the insulating layer 16 and the thickness t2 of the sealing resin layer 40 are substantially equal to each other and more preferably completely equal to each other. By setting t1 and t2 to substantially equal values, it is possible to improve the anti-bending effect of the semiconductor device 1. Here, "substantially equal" means that the thickness ratio expressed by t1/t2 is in the range of 0.95 to 1.05.

For example, the CTE, hereinafter referred to as CTE1, of the insulating layer 16 and the CTE, hereinafter, referred to as CTE2, of the sealing resin layer 40 are preferably substantially equal to each other and more preferably completely equal to each other. By setting CTE1 and CTE2 to the substantially equal value, it is possible to improve the anti-bending effect of the semiconductor device 1. Here, "substantially equal" means that the thickness ratio expressed by CTE1/CTE2 is in the range of 0.95 to 1.05.

When t1<t2 is set, it is preferable that the materials of the insulating layer 16 and the sealing resin layer 40 are selected to satisfy CTE1>CTE2. By setting the CTE in this way, it is possible to improve the anti-bending effect of the semiconductor device 1. The magnitude of the ratio of CTE1 to CTE2 can be determined in consideration of the thickness ratio expressed by t1/t2.

When t1>t2 is set, it is preferable that the materials of the insulating layer 16 and the sealing resin layer 40 are selected to satisfy CTE1<CTE2. By setting the CTE in this way, it is possible to improve the anti-bending effect of the semiconductor device 1. The magnitude of the ratio of CTE2 to CTE1 can be determined in consideration of the thickness ratio expressed by t1/t2.

In the semiconductor chip 30, for example, semiconductor elements such as MOS transistors are formed on a silicon substrate. The thickness of the semiconductor chip 30 is preferably in the range of 50 μm to 200 μm. The CTE of the semiconductor chip 30 is preferably set at 5×10$^{-6}$/° C.

For example, a DAF or an insulating adhesive can be used for the adhesive layer 34.

The first wiring layer 22 can be patterned, for example, with a conductive material such as Cu. The second wiring layer 26 is the same as the first wiring layer 22.

The through-wire 24 can be formed by filling the through-hole formed in the insulating member 12 with a conductive material such as Cu.

(Method of Manufacturing Semiconductor Device)

A method of manufacturing a semiconductor device according to an embodiment of the invention includes the following processes. A process (preparation process) is to prepare a wiring substrate. A process (die bonding process) is to dispose a semiconductor chip in an opening of the wiring substrate. A process (wire bonding process) is to electrically connect the conductor of the wiring substrate to the semiconductor chip. A process (resin sealing process) is to stack a sealing resin layer on the other surface of the insulating material so as to cover the opening and the semiconductor chip. A process (ball mounting process) is to dispose external electrodes connected to the conductor.

Figure 3A:
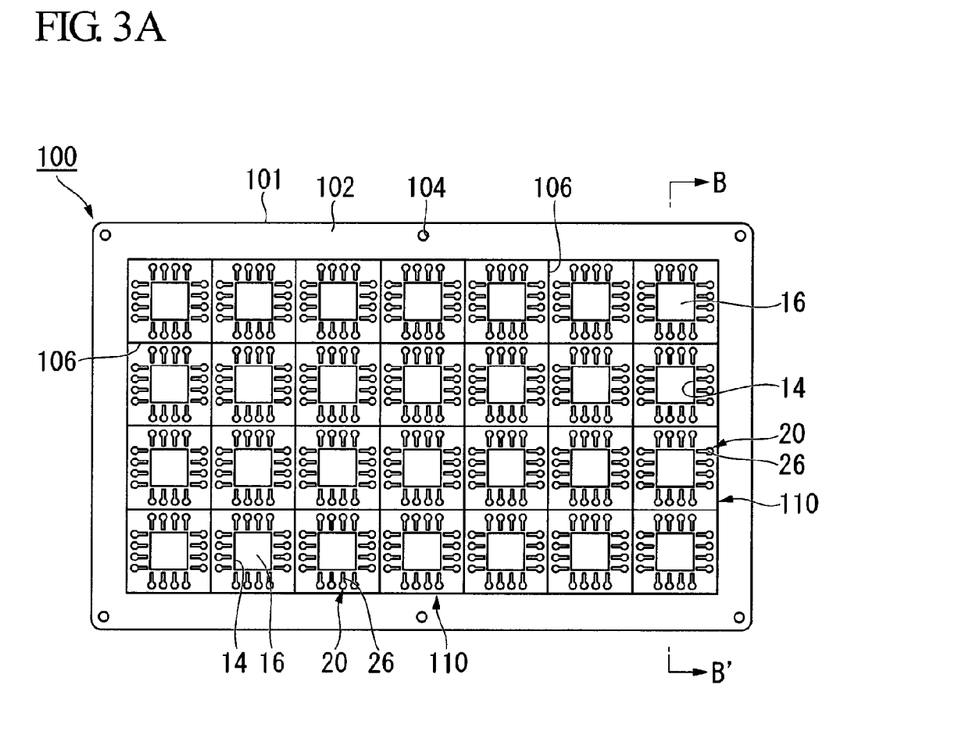
FIG. 3A is a plan view illustrating a wiring base substrate in accordance with a first preferred embodiment of the present invention.
Figure 3B:
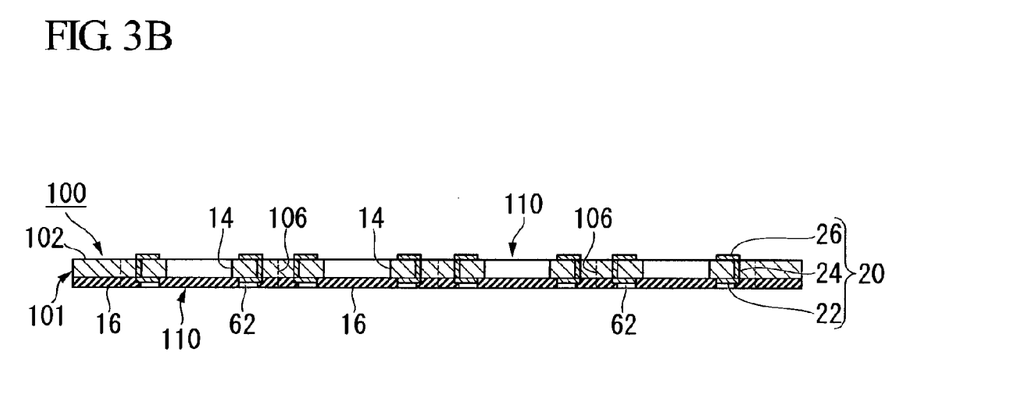
FIG. 3B is a cross sectional elevation view, taken along a B-B' line of FIG. 3A.

An example of the method of manufacturing a semiconductor device according to an embodiment of the invention will be described with reference to FIGS. 3A through 4K. FIG. 3A is a plan view illustrating a wiring base substrate 100 used to manufacture the semiconductor device 1 according to an embodiment of the invention. FIG. 3B is a sectional view taken along line B-B' of FIG. 3A. FIGS. 4A through 4F are sectional views illustrating a process of manufacturing the wiring base substrate 100 used to manufacture the semiconductor device 1 according to an embodiment of the invention. FIGS. 4G through 4K are sectional views illustrating a process of manufacturing the semiconductor device 1 according to an embodiment of the invention.

The preparation process is a process of preparing the wiring base substrate 100 having an opening 14 formed in each product forming section 110 as shown in FIGS. 3A and 3B. The wiring base substrate 100 may be prepared by purchase and may be manufactured by the following manufacturing method.

The base wiring substrate used to manufacture the semiconductor device 1 will be described. As shown in FIGS. 3A and 3B, the wiring base substrate 100 is processed in the MAP method. The wiring base substrate 100 has a configuration such that plural product forming sections 110 are arranged in a matrix shape in an insulating base substrate 101 which is a source of the insulating member 12. Dicing lines 106 for individually separating the product forming sections 110 to form the wiring substrates 10 are formed between the product forming sections 110. The product forming sections 110 have the same configuration as the wiring substrate 10 in the step in which they are cut and separated from each other by the dicing lines 106 to form the respective wiring substrates 10.

A frame 102 is disposed around the plural product forming sections 110 arranged in a matrix array. Positioning holes 104 are disposed in the frame 102 at a predetermined interval to transport or position the frame.

As shown in FIG. 3B, holes are formed in the insulating layer 16 to form the land portions 62 by exposing a part of the first wiring layer 22.

An example of the method of manufacturing the wiring base substrate 100 will be described with reference to FIGS. 4A through 4F. The method of manufacturing the wiring base substrate 100 includes the following processes. A process (opening process) is to form openings in the insulating base material. A process (conductor forming process) is to form conductors in the insulating base material. A process (insulating layer stacking process) is to stack an insulating layer on one surface of the insulating base material.

Figure 4A:
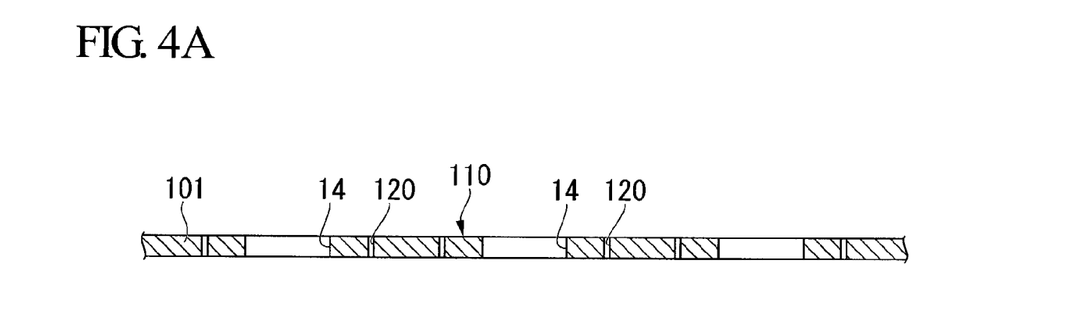
FIG. 4A is a cross sectional elevation view illustrating a wiring base substrate in a step involved in a method of forming the wiring base substrate in accordance with a first preferred embodiment of the present invention.

As shown in FIG. 4A, plural openings 14 are formed at positions corresponding to the product forming sections 110 of the insulating base substrate 101 by punching using a cutting punch or etching (opening process). The insulating base substrate 101 is formed of, for example, a substantially rectangular-shaped glass epoxy base material.

With reference to FIG. 4A, plural via holes 120 are formed at positions corresponding to the through-wires 24 of the insulating base substrate 101 by punching using a cutting punch or etching.

Figure 4B:
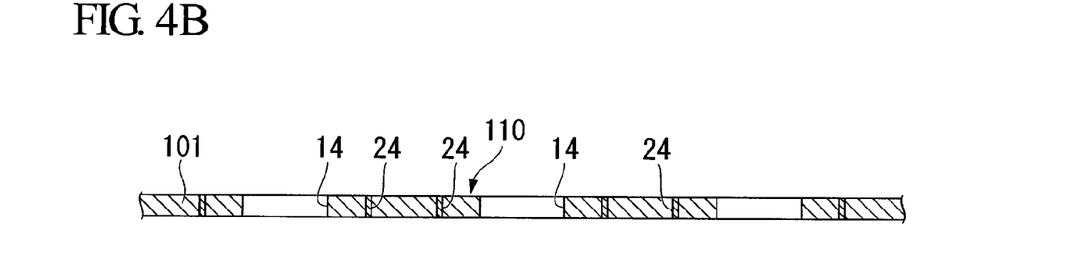
FIG. 4B is a cross sectional elevation view illustrating a wiring base substrate in a step, subsequent to the step of FIG. 4A, involved in a method of forming the wiring base substrate in accordance with a first preferred embodiment of the present invention.

With reference to FIG. 4B, the via holes 120 are filled with a conductive material such as Cu to form the through-wires 24.

Figure 4C:
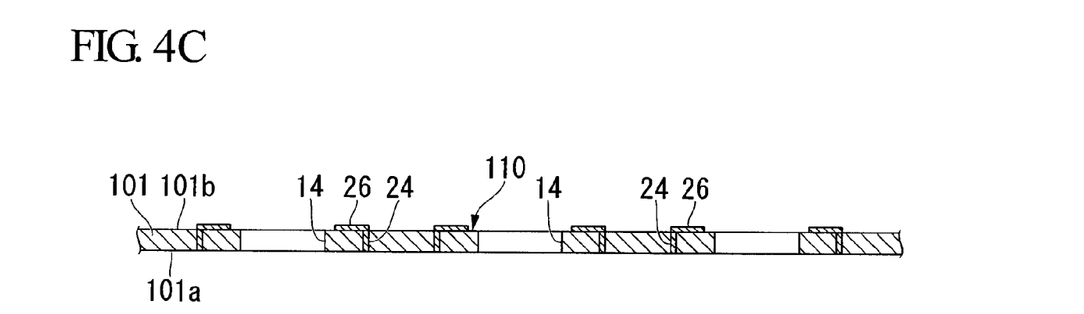
FIG. 4C is a cross sectional elevation view illustrating a wiring base substrate in a step, subsequent to the step of FIG. 4B, involved in a method of forming the wiring base substrate in accordance with a first preferred embodiment of the present invention.

With reference to FIG. 4C, subsequently, by disposing a conductor layer such as a Cu film on the overall surface of the surface 101*b* of the insulating base substrate 101 and etching the conductor layer in a pattern, the second wiring layer 26 is formed.

Figure 4D:
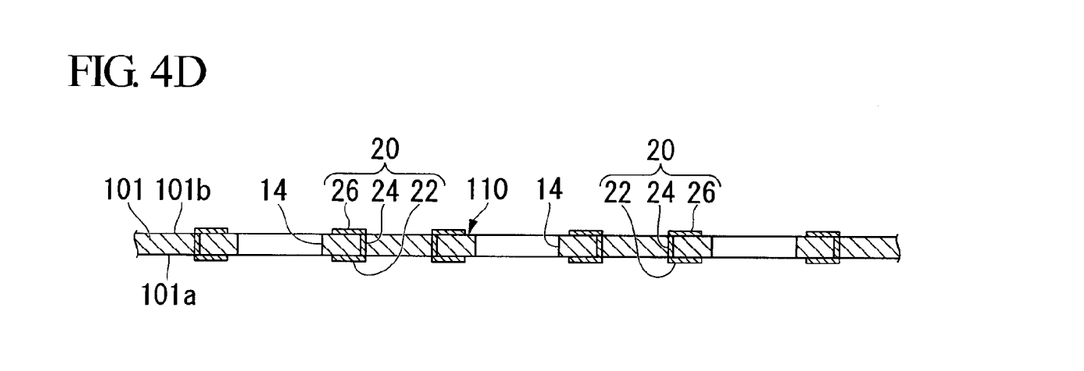
FIG. 4D is a cross sectional elevation view illustrating a wiring base substrate in a step, subsequent to the step of FIG. 4C, involved in a method of forming the wiring base substrate in accordance with a first preferred embodiment of the present invention.

With reference to FIG. 4D, similarly to the surface 101*b* side, the first wiring layer 22 of the pattern is formed on the surface 101*a* of the insulating base substrate 101. In this way, the conductor 20 including the first wiring layer 22, the through-wire 24, and the second wiring layer 26 is formed (conductor forming process).

Figure 4E:
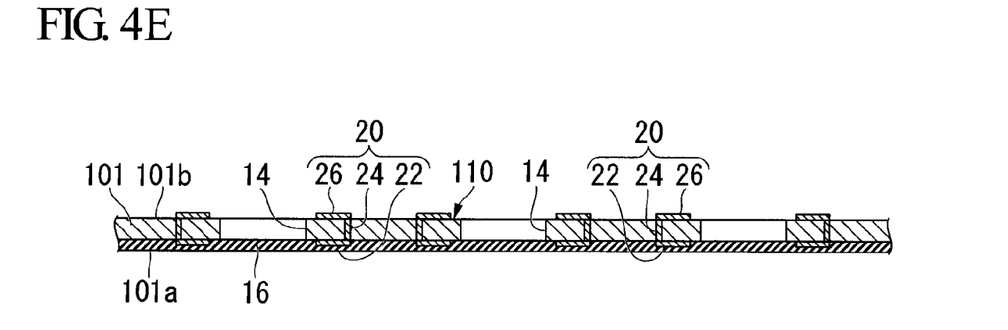
FIG. 4E is a cross sectional elevation view illustrating a wiring base substrate in a step, subsequent to the step of FIG. 4D, involved in a method of forming the wiring base substrate in accordance with a first preferred embodiment of the present invention.

With reference to FIG. 4E, a solder resist film with a thickness of 40 μm or more is disposed on the overall surface of the surface 101*a* to form the insulating layer 16 covering the opening 14 and the first wiring layer 22.

Figure 4F:
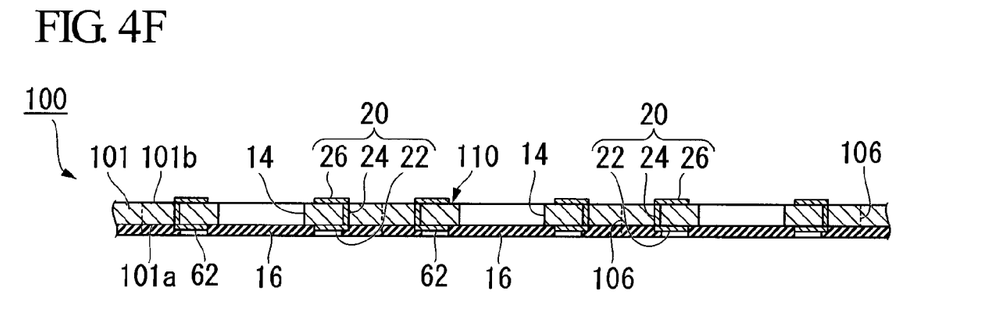
FIG. 4F is a cross sectional elevation view illustrating a wiring base substrate in a step, subsequent to the step of FIG. 4E, involved in a method of forming the wiring base substrate in accordance with a first preferred embodiment of the present invention.

With reference to FIG. 4F, subsequently, the insulating layer 16 corresponding to the land portions on which the external electrodes in the first wiring layers 22 are mounted are etched to form a hole, whereby the land portions 62 are formed by partially exposing the first wiring layers 22 (insulating layer stacking process). In this way, the wiring base substrate 100 can be manufactured.

An example of the method of assembling the semiconductor device 1 using the wiring base substrate 100 will be described with reference to FIGS. 4G through 4K. The method of assembling the semiconductor device 1 includes a die bonding process, a wire bonding process, a resin sealing process, and a ball mounting process.

Figure 4G:
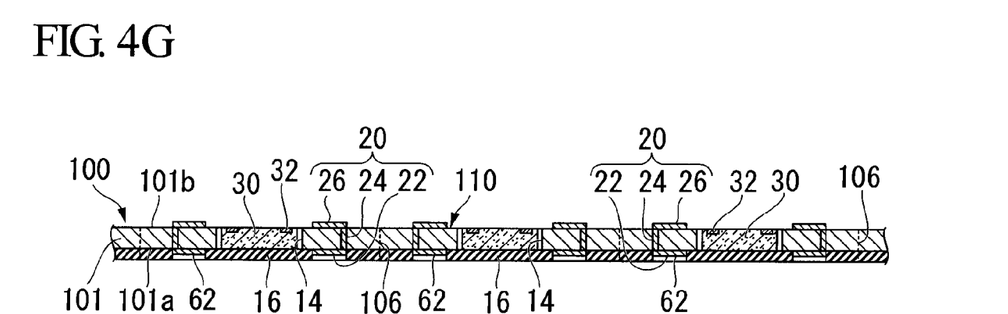
FIG. 4G is a cross sectional elevation view illustrating a wiring base substrate in a step, subsequent to the step of FIG. 4F, involved in a method of forming the wiring base substrate in accordance with a first preferred embodiment of the present invention.

With reference to FIG. 4G the semiconductor chips 30 are disposed in the openings 14 formed in the wiring base substrate 100, respectively. Each semiconductor chip 30 has a surface which is opposite to the surface on which the electrode pad 32 is formed. The opposite surface of each semiconductor chip 30 is adhered and fixed to the insulating layer 16 in the opening 14 with an adhesive layer (not shown) such as a DAF or an insulating adhesive interposed therebetween. At this time, the respective sides of the semiconductor chip 30 are separated from the inner wall of the opening 14 by about 10 μm (die bonding process).

Figure 4H:
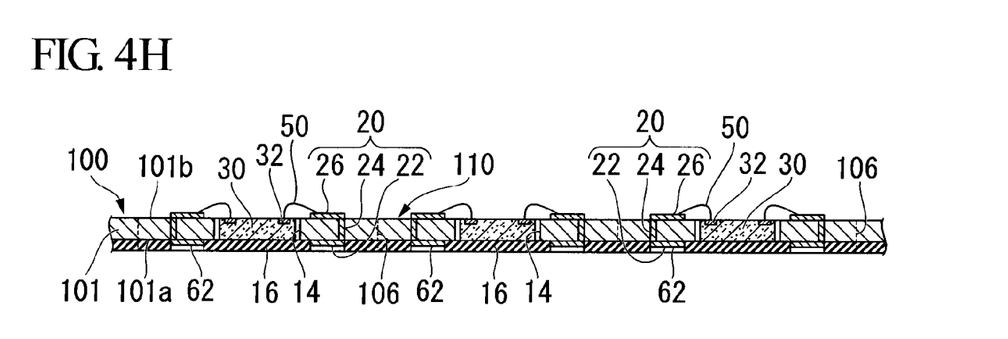
FIG. 4H is a cross sectional elevation view illustrating a wiring base substrate in a step, subsequent to the step of FIG. 4G, involved in a method of forming the wiring base substrate in accordance with a first preferred embodiment of the present invention.

With reference to FIG. 4H, the electrode pad 32 of the semiconductor chip 30 disposed in each opening 14 and the second wiring layer 26 are connected to each other by a conductive material such as a wire 50 formed of Au (wire bonding process). Accordingly, the electrode pad 32 of the semiconductor chip 30 and the first wiring layer 22 corresponding thereto are electrically connected to each other via the wire 50, the second wiring layer 26, and the through-wire 24.

In the wiring bonding process, the wire 50 of which the tip has a ball formed by melting is bonded to the electrode pad 32 by ultrasonic thermo-compression, for example, using a wire bonding apparatus. A loop shape is then formed. The other tip of the wire 50 is bonded to the corresponding second wiring layer 26 by ultrasonic thermo-compression. By disposing the semiconductor chip 30 in the opening 14, it is possible to reduce the length of the wire 50, thereby reducing short-circuits or flow of the wires.

Figure 4I:
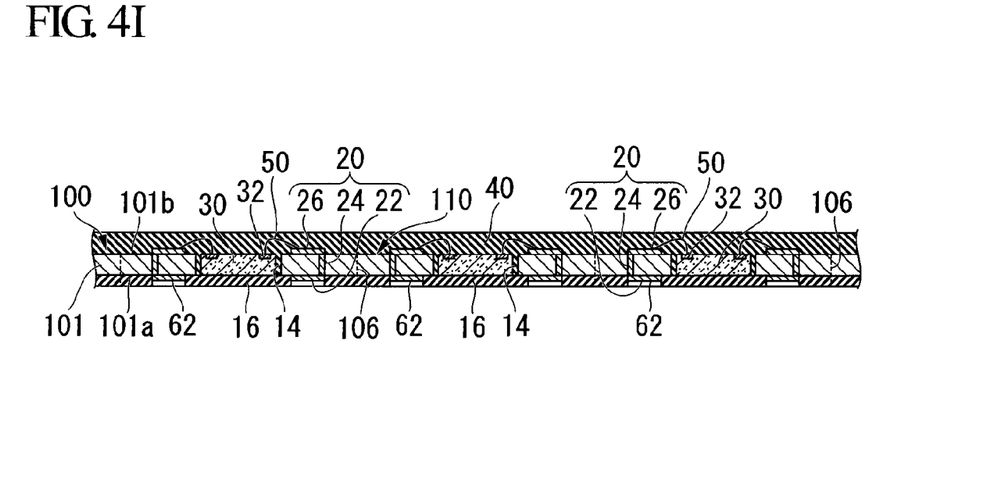
FIG. 4I is a cross sectional elevation view illustrating a wiring base substrate in a step, subsequent to the step of FIG. 4H, involved in a method of forming the wiring base substrate in accordance with a first preferred embodiment of the present invention.

With reference to FIG. 4I, the product forming sections 110 arranged in a matrix array are sealed by a thermoplastic resin (sealing resin) such as epoxy resin. In this way, the sealing resin layer 40 is stacked on the surface 101*b* of the insulating base substrate 101. The sealing resin layer 40 covers at least the openings 14, the semiconductor chips 30, and the wires 50 (resin sealing process). At this time, the clearances between the openings 14 and the semiconductor chips 30 are filled with the sealing resin.

In the resin sealing process, for example, the wiring base substrate 100 is clamped with a shaping mold including an upper mold and a lower mold of a transfer mold apparatus, the epoxy resin is pressed into the cavity formed by the upper mold and the lower mold from a gate, and the sealing resin is thermally cured, whereby the sealing resin layer 40 can be formed.

Figure 4J:
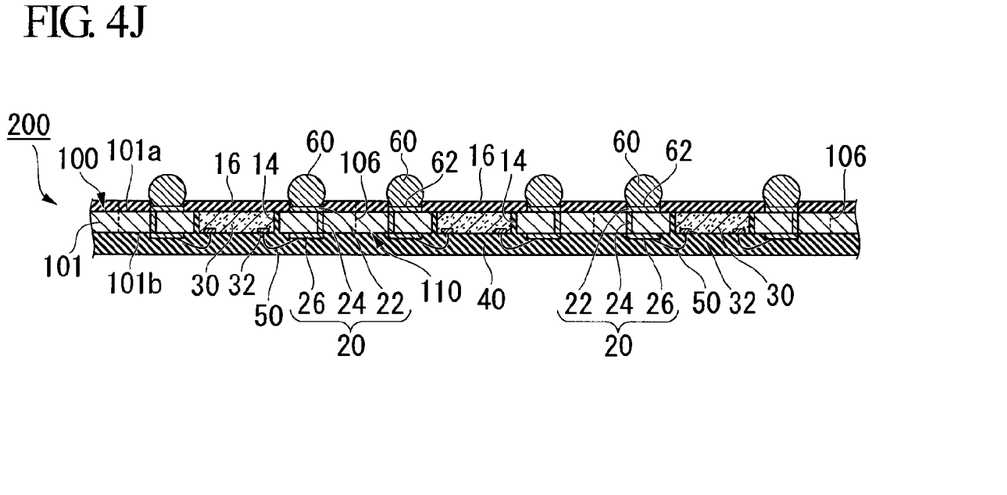
FIG. 4J is a cross sectional elevation view illustrating a wiring base substrate in a step, subsequent to the step of FIG. 4I, involved in a method of forming the wiring base substrate in accordance with a first preferred embodiment of the present invention.
Figure 4K:
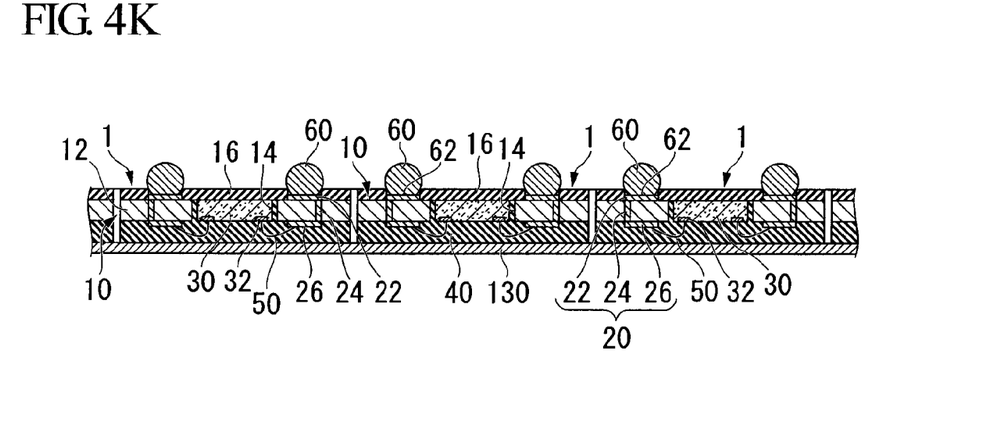
FIG. 4K is a cross sectional elevation view illustrating a wiring base substrate in a step, subsequent to the step of FIG. 4J, involved in a method of forming the wiring base substrate in accordance with a first preferred embodiment of the present invention.

With reference to FIG. 4J, conductive metallic balls (external terminals) 60 are mounted on the land portions 62 arranged in a matrix array on the surface 101*a* of the insulating base substrate 101. In the ball mounting process, the metallic balls 60 formed of, for example, solder are kept in absorbing holes using an absorbing mechanism. The absorbing mechanism has plural absorbing holes. The plural absorbing holes are positioned corresponding to the arrangement of the land portions 62. Flux is transferred to the kept metallic balls 60. As a result, the land portions 62 are mounted. The metallic balls are reflowed after mounting the metallic balls 60. Reflow process can cause the metallic balls 60 as the external terminals to be exposed and fixed from the insulating layer 16. In this way, a terminal-attached base substrate 200 can be obtained. In FIGS. 4J and 4K, the surface 101*a* and the surface 101*b* of the insulating base substrate 101 are inverted with respect to FIGS. 4G to 4I.

With reference to FIG. 4K, the terminal-attached base substrate 200 is cut along the dicing lines 106 to form the individual semiconductor devices 1 (substrate dicing process). In the substrate dicing process, a dicing tape 130 is bonded to the side surface of the sealing resin layer 40 of the terminal-attached base substrate 200 to support the terminal-attached base substrate 200 by the use of the dicing tape 130. The terminal-attached base substrate 200 is horizontally and vertically cut along the dicing lines 106 by the use of a dicing blade to form the individual pieces. In FIG. 4K, the substrate is cut by full-cut dicing, but the individual semiconductor devices 1 are supported by the dicing tape 130. By picking up the semiconductor devices 1 from the dicing tape 130 after finishing the dicing process, it is possible to obtain the semiconductor device 1 shown in FIGS. 1 and 2.

As described above, in the semiconductor device 1 according to an embodiment of the invention, it is possible to reduce the thickness in comparison with the semiconductor device in which the semiconductor chip 30 is mounted on the insulating member 12, by forming the opening 14 in the insulating member 12 and disposing the semiconductor chip 30 in the opening 14. In addition, by stacking the insulating layer 16 on one surface of the insulating member 12 and stacking the sealing resin layer 40 on the other surface, the sealing resin layer 40 also expands or contracts when the insulating layer 16 expands or contracts. The insulating member 12 can be interposed between the insulating layer 16 and the sealing resin layer 40, to improve the thermal expansion balance of the constituent elements of the semiconductor device 1, thereby reducing the generation of stress or bending of the semiconductor device 1. Accordingly, it is possible to prevent the connection failure of the external electrodes 60, thereby improving reliability in the secondary mounting of the semiconductor device 1.

In addition, the thicknesses and the CTEs of the insulating layer 16 and the sealing resin layer 40 can be adjusted to further reduce bending of the semiconductor device 1.

In the semiconductor device 1 manufactured in the above-mentioned MAP method, the wiring base substrate 100 sealed is cut and separated by dicing. Thus, the side surfaces of the wiring substrate 10 and the sealing resin layer 40 are aligned to form a plan surface, thereby obtaining a good hexagonal structure.

In the method of manufacturing the semiconductor device according to an embodiment of the invention, the sealing resin layer 40 is stacked on one surface of the insulating member 12. The sealing resin layer 40 covers the opening 14 and the semiconductor chip 30. Accordingly, the semiconductor device 1 having a configuration, such that the semiconductor chip 30 is disposed in the opening 14 and the insulating member 12 is interposed between the insulating layer 16 and the sealing resin layer 40, can easily be formed without using a semiconductor chip mounting member such as the past support tape.

The invention is not limited to the above-mentioned embodiments.

The plural electrode pads 32 are disposed in the vicinity of the periphery of the semiconductor chip 30 according to the embodiment, but a semiconductor chip having other electrode pad arrangements such as a center pad arrangement may be used.

Although it has been described in the above-mentioned embodiment that the invention is applied to the BGA-type semiconductor device, the invention may be applied to other-types of semiconductor devices such as an LGA (Land Grid Array) type.

Although the method of manufacturing a semiconductor device using a MAP method has been described in the above-mentioned embodiment, the invention is not limited to the method. For example, the individual semiconductor devices may be manufactured using insulating materials cut individually in advance instead of the insulating base material.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising;
   an insulating substrate having an opening which passes entirely through the insulating substrate;
   an insulating layer on a first surface of the insulating substrate, the insulating layer covering the opening so that an entire exposed surface of the insulating layer in the opening is substantially coplanar with the first surface of the insulating substrate;
   a semiconductor chip disposed in the opening;
   an adhesive layer provided between the insulating layer and the semiconductor chip without covering a side surface of the semiconductor chip by the adhesive layer;
   a sealing layer on a second surface of the insulating substrate, the sealing layer sealing the semiconductor chip and the opening, the side surface of the semiconductor chip being covered with the sealing layer;
   a second wiring layer disposed on the second surface of the insulating substrate;
   an electrode pad disposed on a second surface of the semiconductor chip opposite to a first surface of the semiconductor chip; and
   a wire connecting the electrode pad to the second wiring layer.

2. The semiconductor device according to claim 1, further comprising:
   external electrodes disposed on the first surface of the insulating substrate, the external electrodes being partially exposed from the insulating layer.

3. The semiconductor device according to claim 2, further comprising:
   a first wiring layer disposed on the first surface or the insulating substrate, the first wiring layer being connected to the external electrode; and
   a through-wire that penetrates the insulating substrate, the through-wire connecting the first wiring layer and the second wiring layer.

4. The semiconductor device according to claim 2, further comprising:
   a through-wire that penetrates the insulating substrate, the through-wire being electrically connected to an associated one of the external electrodes.

5. The semiconductor device according to claim 1, wherein the wire is buried in the sealing layer.

6. The semiconductor device according to claim 1, wherein a first thickness of the insulating layer is substantially the same as a second thickness of the sealing layer, the second thickness is defined between the second surface of the insulating substrate and a surface of the sealing layer.

7. The semiconductor device according to claim 1, wherein the insulating layer is substantially the same in coefficient of thermal expansion as the sealing layer.

8. The semiconductor device according to claim 1, wherein a first thickness of the insulating layer is thinner than a second thickness of the sealing layer, the second thickness is defined between the second surface of the insulating substrate and a surface of the sealing layer, and
   the insulating layer is greater in coefficient of thermal expansion than the sealing layer.

9. The semiconductor device according to claim 1, wherein a first thickness of the insulating layer is thicker than a second thickness of the sealing layer, the second thickness is defined between the second surface of the insulating substrate and a surface of the sealing layer, and
   the insulating layer is smaller in coefficient of thermal expansion than the sealing layer.

10. The semiconductor device according to claim 1, wherein the sealing layer covers entirely the second surface of the insulating substrate.

11. The semiconductor device according to claim 1, wherein the semiconductor chip is mounted on the insulating layer.

12. The semiconductor device according to claim 1, wherein a cross-section of the opening is larger than a cross-section of the semiconductor chip.

13. The semiconductor device according to claim 1, wherein the adhesive layer is in contact with the insulating layer and the semiconductor chip.

14. The semiconductor device according to claim 1, wherein a side surface of the sealing layer is aligned with a side surface of the insulating substrate.

15. A semiconductor device comprising:
an insulating substrate having an opening which passes entirely through the insulating substrate;
a semiconductor chip disposed in side the space of the opening;
external electrodes disposed on a first surface of the insulating substrate;
an insulating layer disposed over the first surface of the insulating substrate, the insulating layer covering the opening so that an entire exposed surface of the insulating layer in the opening is substantially coplanar with the first surface of the insulating substrate;
an adhesive layer provided between the insulating layer and the semiconductor chip without covering a side surface of the semiconductor chip by the adhesive layer;
a sealing layer sealing the semiconductor chip, the side surface of the semiconductor chip being covered with the sealing layer;
a second wiring layer disposed on a second surface of the insulating substrate;
an electrode pad disposed on a second surface of the semiconductor chip opposite to a first surface of the semiconductor chip; and
a wire connecting the electrode pad to the second wiring layer.

16. The semiconductor device according to claim 15, wherein the sealing layer seals the semiconductor chip and the opening so as to cover a second surface that is opposite to the first surface of the insulating substrate.

17. A semiconductor device comprising:
a wiring substrate comprising:
an insulating substrate having an opening which passes entirely through the insulating substrate;
a first wiring layer disposed on a first surface of the insulating substrate;
a second wiring layer disposed on a second surface of the insulating substrate;
a through-wire that penetrates the insulating substrate, the through-wire connecting the first wiring, layer and the second wiring layer; and
an insulating layer on a first surface of the insulating substrate, the insulating layer covering the opening so that an entire exposed surface of the insulating layer in the opening is substantially coplanar with the first surface of the insulating substrate;
a semiconductor chip disposed in the opening, the semiconductor chip being electrically connected to the second wiring layer;
an adhesive layer provided between the insulating layer and the semiconductor chip without covering a side surface of the semiconductor chip to the adhesive layer;
a sealing resin layer on a second surface of the insulating substrate, the sealing resin layer sealing the semiconductor chip and the opening, the side surface of the semiconductor chip being covered with the sealing resin layer;
external electrodes disposed on the first surface of the insulating substrate, the external electrodes being partially exposed from the insulating layer;
an electrode pad disposed on a second surface of the semiconductor chip opposite to a first surface of the semiconductor chip; and
a wire connecting the electrode pad to the second wiring layer.

18. The semiconductor device according to claim 17, where in a first thickness of the insulating layer is substantially the same as a second thickness of the scaling resin layer, the second thickness is defined between the second surface of the insulating substrate and a surface of the sealing layer.

19. The semiconductor of device according to claim 17, wherein the insulating layer is substantially the same in coefficient of thermal expansion as the sealing resin layer.

20. The semiconductor device according to claim 17, wherein a first thickness of the insulating layer is thinner than a second thickness of the sealing resin layer, the second thickness is defined between the second surface of the insulating substrate and a surface of the sealing resin layer, and
the insulating layer is greater in coefficient of thermal expansion than the sealing resin layer.

21. The semiconductor device according to claim 17, wherein a first thickness or the insulating layer is thicker than a second thickness of the sealing resin layer, the second thickness is defined between the second surface of the insulating substrate and a surface of the sealing resin layer, and
the insulating layer is smaller in coefficient of thermal expansion than the sealing resin layer.

* * * * *